United States Patent [19]
Wegmann et al.

[11] Patent Number: 5,343,112
[45] Date of Patent: Aug. 30, 1994

[54] CATHODE ARRANGEMENT

[75] Inventors: Urs Wegmann, Oberschan; Albert Koller, Sargans, both of Switzerland

[73] Assignee: Balzers Aktiengesellschaft, Blazers, Liechtenstein

[21] Appl. No.: 892,623

[22] Filed: Jun. 1, 1992

Related U.S. Application Data

[63] Continuation-in-part of Ser. No. 449,547, Dec. 12, 1989, abandoned.

[30] Foreign Application Priority Data

Jan. 18, 1989 [DE] Fed. Rep. of Germany ....... 3901337

[51] Int. Cl.$^5$ .............. H01J 1/16; H01J 19/10
[52] U.S. Cl. ............... 313/346 R; 313/349; 313/341; 313/344
[58] Field of Search ............ 313/346 R, 346 DC, 310, 313/341, 344, 349

[56] References Cited

U.S. PATENT DOCUMENTS

| | | | |
|---|---|---|---|
| 2,919,373 | 12/1959 | Riley et al. | 313/345 |
| 3,341,917 | 9/1967 | Oyabu et al. | 313/346 R |
| 4,119,882 | 10/1978 | Chin | 313/422 |

FOREIGN PATENT DOCUMENTS

| | | |
|---|---|---|
| 0978627 | 4/1952 | France . |
| 1065540 | 1/1954 | France . |
| 2192751 | 1/1988 | United Kingdom . |

OTHER PUBLICATIONS

Leung et al., Rev. Sci. Instrum 55(7) Jul. 1984, pp. 1064–1069 "Directly heated lanthanum hexaboride filaments".
Leung et al., Rev. Sci. Instrum 57(7) Jul. 1986; pp. 1274–1277 "Directly heated lanthanum hexaboride cathode".
LBL—Berkely, Calif. 94720 Feb. 18, 1986 p. 31 "Neutral-Beam Development".
Goebel et al. Rev. Sci. Instrums. 56 (10) Oct. 1985, Am. Inst. of Physics, pp. 1888 to 1893.
Schiller et al. "Elektronenstrahltechnologie" Stuttgart, 1977 pp. 40 to 43.
S. Tanaka et al., Rev Sci. Instums. 59(1) Jan. 1988 pp. 120–124 "Steady-state discharge test of coaxial $LaB_6$ cathode".

*Primary Examiner*—Donald J. Yusko
*Assistant Examiner*—Michael Horabik
*Attorney, Agent, or Firm*—Notaro & Michalos

[57] ABSTRACT

A cathode arrangement for emitting electrons includes an electrode-conductive emission body that defines an emission surface from which the electrons propagate. A slit pattern is cut into the emission body for dividing the emission body into a current path. Two spaced apart conductive terminals on the emission body connect opposite ends of the current path for carrying current along the emission body that is used to heat the emission body by Joule heat.

17 Claims, 2 Drawing Sheets

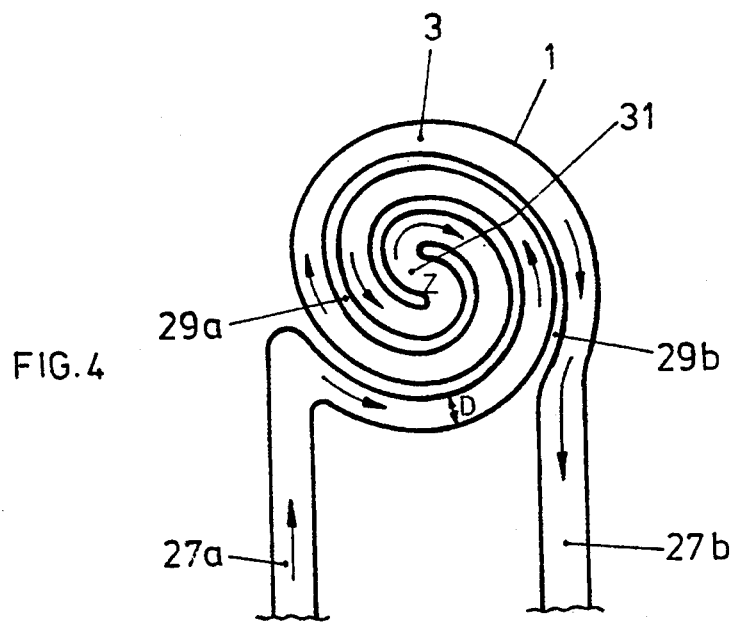
FIG. 4
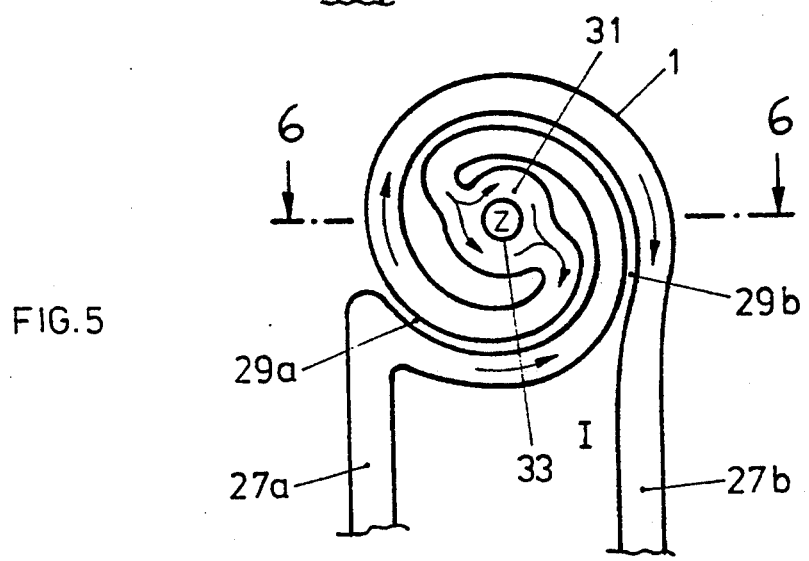
FIG. 5
FIG. 6
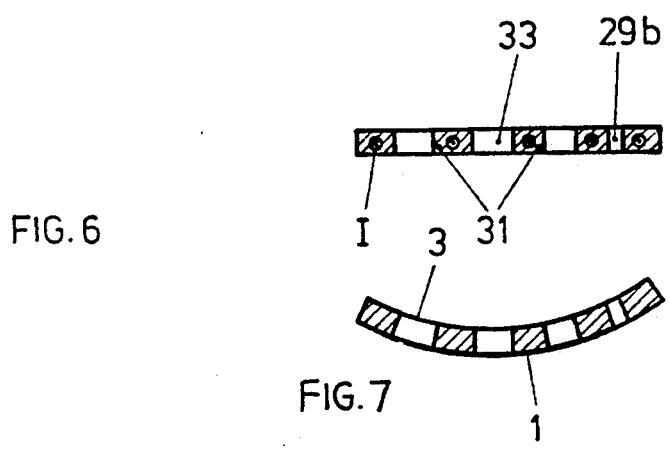
FIG. 7

CATHODE ARRANGEMENT

This application is a continuation-in-part, of application Ser. No. 07/449,547, filed Dec. 12, 1989, and now abandoned.

FIELD AND BACKGROUND OF THE INVENTION

The present invention is directed to a cathode arrangement for the emission of electrons, a method for producing such a cathode arrangement and an electron beam source comprising such a cathode arrangement, and further to a vacuum treating arrangement with the said electron beam source.

In the electronic industry for the production of integrated circuitry as well as in the industry for producing hard layers or optical anti-reflex coatings, it is well-known to use electron beam evaporation processes. To achieve the high requirement with respect to homogenity of the coating thickness as well as to reach a high degree of reproductivity of the coatings, it is for such evaporation of high importance to provide for a thermically stable beam source system with a precise emission cathode for a reproducible cathode spot on a crucible of the evaporator. Thereby it is known to deflect the electron beam by about 270° with the aid of an electron optical unit before the beam strikes the crucible. The position of the spot on the crucible is either open-loop or negative feedback, close-loop controlled. The distribution of energy over the evaporation spot and the overall energy over the evaporation surface of the crucible is also controlled. With respect to the heated cathode, thus the following criteria are of predominant importance:

high degree of material purity,
long times of possible use,
a satisfying space distribution of electron emission to ensure good electron-optical picturing with a high degree of reproductivity,
short reaction times to respond to changes in energy by means of adjustment of the heater arrangement.

Generally there are known two kinds of electron emission cathodes for said electron beam sources. In the first kind, the emission means are indirectly heated, i.e. the electron emitting part is provided in close proximity of, but separate from a heating arrangement.

Such a cathode arrangement is e.g. known from the article "Large area lanthanum molybdenum electron emitters" of D. M. Goebel et al, Rev. Sci. Instrum. 56(10), October 1985, American Institute of Physics, pages 1888 to 1893.

The advantage of such indirectly heated cathode arrangements is that the emitting surface is large. It is, on the other hand, a disadvantage that the construction is quite complicated to ensure the cathode heating, especially if there is considered that the heating arrangement must be dimensioned for a relatively high power in view of the distance between the emitting part and the heating arrangement therefor. The efficiency of such an arrangement is therefore poor because a substantial part of the heating energy is lost into the surroundings.

Further, such cathodes react slowly if a change of heating energy is applied for changing the emission energy of the beam, and such cathode arrangements are not suited for the use of emitting material with high operating temperatures as for tungsten.

A further kind of so-called indirect cathode heating, involves shooting electrons to the cathode which is to be used for the evaporation process, from behind. For this purpose, a secondary cathode is used with corresponding apparatus. In these cathode arrangements, the disadvantages mentioned above for cathode arrangements which are indirectly heated by heat radiation, do substantially not occur, but the efforts needed for construction are great. This latter procedure is primarily used for big area evaporator cathodes.

The second type of electron emission cathode is directly heated, in that the cathode is formed by a conductive wire which is heated by Joule heat. An electric current is passed through the wire and thus the wire is activated to emit electrons. Such a directly heated cathode arrangement as well as the above mentioned electron bombardment heating is e.g. known from "Elektronenstrahltechnologie" of Schiller, Heisig, Panzer, Wissenschaftliche Verlagsgesellschaft mbH, Stuttgart, 1977, pages 40 to 44.

The advantage of directly heated cathodes is the improved efficiency in that the heating energy is significantly better exploited compared with indirectly heated cathodes, and that further there is only needed a reduced constructional effort. A disadvantage is that for such known electron emitting cathodes with an electric wire, the Overall surface defined by such a wire is purely exploited for emission. Due to constructional limits the cathode wire may not be wound too tight to cover a predetermined area because a mutual contact of the wire segments must be prevented. The inherent elasticity of such wires and the problem to dispose parts of the wire as closely as possible one beside the other, result in the fact that within an overall area defined by such a wire cathode, a predominant part is occupied by gaps and only a smaller amount by the wire itself and thus there is only a smaller part which is in fact electron emitting.

Further, the usually circular cross-section of the wire emits electrons radially distributed to all sides with respect to the axis of the wire which leads to a disadvantageously diffused overall emission characteristic over the wire coil cathode with undesired characteristics for forming the beam.

From "Neutral-Beam Development", LBL, Berkeley, Calif. 94720, a heating helix, coated with $LaB_6$-crystals, is known, whereby the coating is heated as electron source with the help of the embedded helix.

In this context see also:
Steady-state discharge test of coaxial $LaB_6$ cathode of S. Tanaka et al.; Rev. Sci. Instrum. 59(1), January 1988,
Directly heated lanthanum hexaboride filaments of K. N. Leung et al.; Rev. Sci. Instrum. 55(7), July 1984,
Directly heated lanthanum hexaboride cathode of K. N. Leung et al.; Rev. Sci. Instrum. 57(7), July 1986.

This technique is extremely complicated, especially if the thermical loading of the coating is considered. Here too, there is in fact provided an indirect heating, in that the emitting coating material is heated by the non-emitting heating helix. The same is valid for the electron emission cathode, known from the German laid open Patent no. 29 33 255 which is made of a ceramic material which is composed of $LaB_6$ and of an electro-conductive material which latter is provided for heating purposes.

SUMMARY OF THE INVENTION

It is an object of the present invention to combine the advantages of indirectly heated electron emission cathode arrangements, i.e. the large emitting surface and the good emission distribution, with the advantage of a directly heated electron emitting wire cathode, i.e. its small thermical inertia, its simple and compact construction, and the possibility to minimize the geometric extent of the construction, further the possibility to use and apply cathode material which has to be operated at high temperatures.

To fulfill this object the present invention proposes a cathode arrangement for the emission of electrons, comprising electro-conductive emission means defining an emission surface, a heater arrangement, said heater arrangement being formed by said emission means defining said emission surface, said emission means being therefore provided with a slit pattern, said slit pattern defining a current conductor out of said emission means between at least two conductive terminals of said emission means for applying an electric current through said emission means for heating up said emission means by Joule heat.

The invention departs from the recognition that starting with a defined surface as known from cathodes with indirect heating, it is possible to provide therein slits, so as to form within said surface means one or more than one electrical conductors which allow direct heating of this emission means by Joule heat. Thereby the large emitting surface is substantially maintained: The slits may be provided practically as thin as desired, so that the possibility is given to dispose the conductor which is formed by the slits with parts laying narrow one beside the other. The conductor parts formed by the slits laying very closely one beside the other, have substantial rectangular cross-sections, so that there results a substantially steadily emitting surface which on its side results in an evenly distributed emission and thus in good electron-optical and in respectively good picturing qualities. The thermical inertia is small which is important for open-loop controlling, but especially for negative feedback controlling purposes. Efforts needed for construction are small.

To further improve the good emitting qualities, the width of the slits of the slit pattern at least along substantial parts of the slit pattern are chosen to be smaller than the width of a current conductor which is defined by the slit pattern.

A most simple construction of the inventive cathode arrangement comprises slits starting at opposite peripheral edges of the emission means defining the emission surface, which run towards each other and which are staggered with respect to each other to maintain material integrity of the emission means. By the slits staggered with respect to each other, a meander shaped current conductor is formed.

A preferred embodiment of the inventive cathode arrangement comprises two helically arranged slits which run substantially one beside the other towards a central area of the emission means which define the emission surface.

This results in a substantial axially symmetric arrangement which has been found as most advantageous with respect to heat distribution and emission distribution.

To further compensate for the magnetic field which is caused by the heating current flowing through the inventive cathode arrangement, which could lead to undesired deflection of the electrons emitted, it is proposed to provide the inventive cathode arrangement so that, when propagating from one conductive terminal to the other, along the current conductor, significant parts of the current conductor which lay one beside the other separated by a slit of the slit pattern, are passed through in opposite direction.

It is known that the central area of such cathode arrangements are especially exposed to erosion by ion bombardment because this central area is normally disposed within the electron-optical axis of electron-optical means provided downstream the emitting cathode with respect to beam propagation. If the material integrity of this central area is maintained, there results an uncontrolled erosion which significantly reduces lifetime of such cathodes. For wide areal indirectly heated cathodes it is therefore known, as e.g. from "Elektronenstrahltechnologie" mentioned above, to provide a central opening within the cathode to improve its lifetime. Then the ions may penetrate the central opening. By preventing an uncontrolled erosion, there is prevented an uncontrolled change in the emitting surface of such a cathode during its lifetime. To prevent this ion erosion in the inventive cathode arrangement, in a preferred embodiment and in a central area of the emission means an opening is provided which is either an opening separate from the slit pattern or an opening formed by an enlarged slit area of a slit of the pattern.

By the slit pattern defining a current conductor with cross-sectional areas which vary at least along a part of the current conductor when propagating along the conductor, it becomes possible to selectively control the local electron emission rate along the emission surface defined by the emission means, due to the fact that such varying cross-sectional areas do locally vary the Joule heat distribution and thus the local electron emission rate.

Because the electron emitting means which are inventively slit remain relatively stiff, the emission means may be formed into an unplanar emission surface, i.e. a selectably bent spatial area. This permits to optimal tailoring of the electron picturing properties by the electron-optical system.

The slits are preferably processed by arc erosion or wire erosion or by laser cutting.

An inventive method for producing a cathode arrangement with the improved qualities mentioned above for emission of electrons comprises the steps of providing a substantially planar and at least along substantial parts electro-conductive plate, cutting by at least one of arc erosion and of wire erosion and of laser cutting a pattern of slits into said plate, said slits of said pattern defining a current path out of said plate.

An electron beam source which result in an improved emission characteristic of electrons, comprises a cathode arrangement for the emission of the electrons, the cathode arrangement comprising electroconductive emission means defining an emission surface, further comprising a heater arrangement whereby the heater arrangement is formed by said emission means defining the emission surface, the emission means being therefore provided with a slit pattern defining a current conductor out of the emission means between at least two conductive terminals of said emission means, so as to apply through said emission means an electric current for heating up the emission means by Joule heat.

The present invention also provides a vacuum treating arrangement with an electron beam source generating an electron beam within said vacuum treatment arrangement, whereby said electron beam source comprises a cathode arrangement for the emission of electrons to form said beam, the cathode arrangement comprising electro-conductive emission means defining an emission surface and a heater arrangement. The heater arrangement is formed by said emission means defining said emission surface, the emission means are therefore provided with a slit pattern, said slit pattern defining a current conductor out of the emission means between at least two conductive terminals of said emission means, so as to apply through said emission means an electric current for heating up the emission means by Joule heat. This inventive arrangement has an improved possibility of control and reproductivity of electron beam effects on the target to which the electron beam is shot.

BRIEF DESCRIPTION OF THE DRAWINGS

The invention will now be described by way of examples with the help of the figures.

In the drawings:

FIG. 4 is a plan view of a further and preferred embodiment of an inventive cathode arrangement, FIG. 5 is a plan view of a further and preferred embodiment of an inventive cathode arrangement with a central opening, FIG. 6 is a cross-sectional view, taken along line 6—6, through a cathode arrangement according to FIG. 5, forming such a cathode arrangement; and FIG. 7 is a view similar to FIG. 6 with the cathode arrangement bent to result in a concave emitting surface cave emitting surface.

DESCRIPTION OF THE PREFERRED EMBODIMENTS

Figure 1:
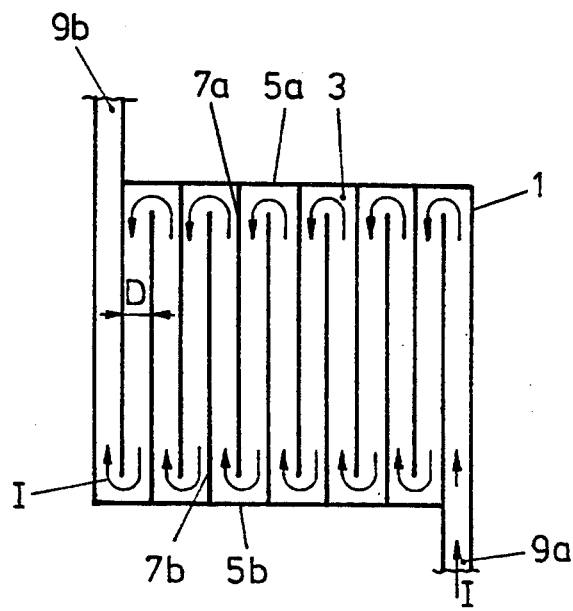
FIG. 1 is a plan view of a first embodiment of a cathode arrangement according to the present invention.

In FIG. 1, a first embodiment of an inventive cathode arrangement is shown. The cathode arrangement comprises a cathode body 1 which is substantially plate shaped. In the example shown in FIG. 1, the cathode body 1 defines a rectangular emitting surface 3. Departing from edges 5a and 5b opposite to each other, are respective sets of staggered slits 7a and 7b run towards each other which are provided through the body 1, so that between two peripheral contacting conductive terminals 9a and 9b there is formed a meander shaped current conductor or path "I" which is substantially disposed bifilarly. The two sets of slits 7a and 7b by which the structural integrity of the body 1 is not interrupted, are preferably machined by electro erosion or by laser cutting into the body 1 and these slits are significantly smaller in width than the width D of adjacent parts of the current conductor "I" defined by the slits. Additionally the width D of the current conductor or path "I" is preferably larger than the thickness of the body 1. In operation, a heating current is applied as shown by the arrows, from one of the two terminals 9 to the other to heat the cathode body 1 by Joule heat so as to activate the body 1 to emit electrons.

Figure 2:
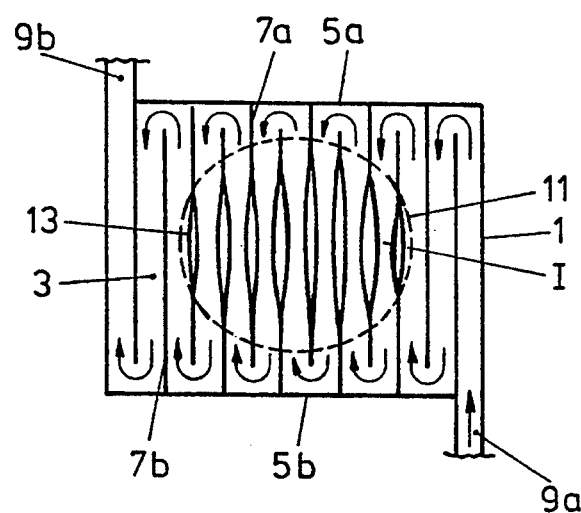
FIG. 2 is a plan view of an inventive cathode arrangement similar to that of FIG. 1 on which the local heat distribution and thus electron emission is controlled by varying the width of the slits.

In FIG. 2 an inventive cathode arrangement is which basically departs from the one shown in FIG. 1. The cathode arrangement according to FIG. 2 has slits 7a and 7b which are specifically designed, so as to control the local distribution of the emission surface heating and thus of the local electron emission.

The same reference numbers are used as in FIG. 1.

Within a central area of the cathode body 1, and thus of the emission surface 3, substantially within the dashed circle 11, the slits are enlarged as shown at 13, generally in one or more than one step or, and as shown in FIG. 2, steadily, so that in this area there results a reduced cross-section of the neighbouring branches of the current conductor "I", thus a higher development of heat, due to the higher resistance in narrowed down conductor branches, compared with parts of the conductor with a wide cross-section. Thus, in this area 11 the electron emission is higher compared with that in other regions of the emission surface 3.

By this technique, i.e. by varying the conductor cross-section, it becomes possible to selectively influence the local distribution of electron emission or to adjust it. The processing of such slits by arc erosion, wire erosion or laser cutting is again simple and not expensive.

Figure 3:
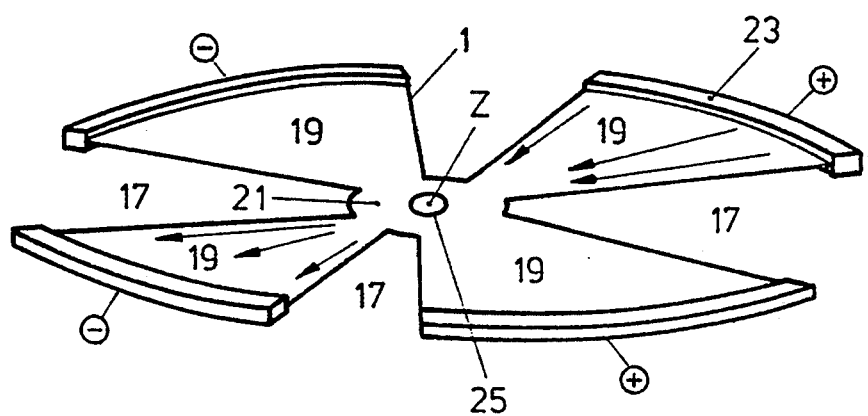
FIG. 3 is a perspective view of a further embodiment of an inventive cathode arrangement.

In FIG. 3 there is perspectively shown a further embodiment of an inventive cathode arrangement. The cathode body 1 is in this example rotationally symmetric with respect to a center Z and comprises four segment-shaped current conductors 19 which are separated from each other by slits 17. The current conductor segments 19 are linked to each other at the central area 21 to maintain structural integrity of the body 1. If, as shown at the periphery, current feeding terminals 23 are connected, e.g. to the polarities as indicated, there occurs at the central area 21 an enlarged current density and thus, at least substantially rotationally symmetrically, a bell-shaped heat distribution and an accordingly shaped emission distribution. To prevent the cathode from being harmed by ion bombardment under self focussing which would lead to an unwanted erosion at the center Z, there is preferably provided in the center Z an opening 25 within body 1, through which the ion stream may pass without harming the cathode. Principally, an opening in the cathode is separately provided or as a part of a slit of the slit pattern, which is there, i.e. in the central area, enlarged, is located so that an optical axis of an electron-optical system, located downstream of the cathode arrangement with respect to electron beam propagation, crosses the cathode body at that opening.

In FIG. 4 there is shown a preferred embodiment of an inventive cathode arrangement. The cathode body 1, again formed as a flat body, defines an emission surface 3 which is substantially circular. The slit pattern comprises a first spiral-like slit 29a which propagates towards the center Z and which departs from a current terminal 27a. A second spiral-shaped slit 29b running again towards the central area Z, runs along the first slit 29a. Within the central area Z, the integrity of the body 1 is maintained by means of a bridge area 31, so that the two spiral-like slits 29a and 29b define a bifilar current conductor "I", through which, and as shown with the arrows, the heating current may be driven.

Here too, the width of the slits 29a, 29b respectively, is smaller than the width D of the current conductor "I", and here too the heat development may be selectively controlled and influenced, as was shown with the aid of FIG. 2, by locally varying the cross-sections of the current conductor, be it discontinuously or steadily. As in all examples shown, the width D is preferably larger than the thickness of the plate-like member which generally forms the cathode body 1.

In FIG. 5 a further preferred embodiment of the inventive cathode arrangement is shown which is similar to that shown in FIG. 4. Therefore, the see reference numbers as were used in FIG. 4 are used. Differently from the embodiment of FIG. 4, the central bridge area 31 which bridges the two spiral-like slits 29a and 29b, has a circular shape and comprises, in analogy to the explanations with respect to FIG. 3, an opening 33 which is preferably circular to prevent ion bombardment erosion. The slits of the embodiment of FIGS. 4 and 5 are again preferably processed by arc or wire erosion or by laser cutting.

By the fact that at the inventive cathode arrangement slits are worked into a principally plate-like body, the elasticity of the resulting body remains significantly smaller than is encountered at directly heated, spiral-shaped wire-wound cathodes.

This brings the additional essential advantage that the inventive cathode arrangement may be easily formed and remains in a given desired form, so that, and preferably after processing of the slits, the cathode body 1 may especially be convexly or concavely bent to follow a predetermined spatial surface.

In FIGS. 6 and 7 the last mentioned technique is shown in that in FIG. 6 a section according to line 6—6 through a cathode arrangement according to FIG. 5 is shown. After processing the cathode in an at least nearly planar configuration, e.g. by means of a pressing operation, there is formed, out of the planar configuration, a concave form.

In this way, and according to the specific requirements, there is formed an optimal electron emission surface 3 of the cathode body 1.

As materials for the realization of the inventive cathode, e.g. tungsten or 1% thorium treated tungsten or tantalum or molybdenum-lanthanum are used.

The inventive cathode arrangement is especially useful as an electron source for an electron beam source in a or for a vacuum treating arrangement.

The present invention is particularly useful as an electron beam source for an improved electron optical picturing device, since the off-set mounting of the terminals as shown in FIGS. 4 and 5, allows the helical conductor to expand and contract when it is heated and allowed to cool, without distorting the optical surface, that is the planar or curved optical surfaces of FIGS. 6 and 7. This is achieved by having the terminals 27a and 27b connected to the opposite ends of the helical current path into which the emission body is formed by the slits 29a and 29b, and at the periphery of the body, and off-set with respect to a diameter across the body. In this way, the conductive terminals are near each other and on one side of the body as opposed to being symmetrical on opposite sides of the body. It has been found that by off-setting the terminals and providing them at a location spaced away from the diameter, expansion of the helical path takes place in an even spreading fashion between the terminals.

When the terminals are positioned on opposite sides of the periphery as shown for example in U.K. Patent Application GB-2,192,751 at FIG. 25 thereof, the expanding helical path is squeezed and constricted between the opposite terminals. This causes distortion in the turns of the helices which must either distort upwardly, downwardly or in an irregular manner, changing the surface of emission for the electrons and thus changing the focus or optical characteristics of the electron emission. This type of distortion does not occur when the terminals are off-set with respect to the diameter of the emission body as in the present invention, and particularly as shown in FIGS. 4 and 5.

A further structural feature of the invention shown in FIGS. 4 and 5 which advances the lack of distortion in the body when it expands, is the fact that one of the terminals 27a is connected to one end of the helical path at a relatively sharp bend while the other terminal 27b is connected to the opposite end of the helical path at a relatively gentle bend or with very little bend. This allows the terminals to be on the same side of the body. Advantageously, the terminals may also lay in the same plane as the plane containing the body, whether that plane is flat or curved, and further it is advantageous to have the terminals substantially parallel to each other and extending from the body in the same direction. Primarily, however, distortion is prevented by off-setting the terminals which are connected to the opposite ends of the helical path, with respect to a diameter of the body.

We claim:

1. In an electron beam source for electron beam evaporation, which source comprises an electron emission cathode for electron optical picturing without distortion when the cathode is heated and cooled, said electron emission cathode, comprising:

an electro-conductive emission body defining an emission surface, said emission body having at least two spaced conductive terminals for applying an electric current through said emission body for heating said emission body by Joule heat, and said emission body having a slit pattern therein formed by two helically arranged slits running substantially one beside the other from a periphery of said body toward a central area of said body defining said emission surface, said slit pattern forming out of said emission body a helical current path to be heated by said Joule heat and extending between said spaced conductive terminals at said periphery for receiving electric current, said conductive terminals being at opposite ends of said helical path and at the periphery, said conductive terminals also being near each other on one side of said body with respect to a diameter of said body, and said conductive terminals being off-set with respect to each other, at said periphery of said body and by the diameter across said body.

2. An electron beam source according to claim 1, including, in said central area an opening being one of an opening separate from said slit pattern and an opening formed by an enlarged slit area of said slit pattern, electron optical picturing of the cathode being along an optical axis passing through said opening.

3. An electron beam source according to claim 2, wherein said opening is at least substantially circular.

4. An electron beam source according to claim 1, wherein said slit pattern forming said current path has a cross-section area varying at least along a part of said current path for selectively controlling a local electron emission along said emission surface.

5. An electron beam source according to claim 1, wherein said emission body defining a non-planar emission surface.

6. An electron beam source according to claim 1, wherein said emission body defining a substantially planar emission surface.

7. An electron beam source according to claim 1, wherein said slit pattern is produced by at least one of arc erosion, wire erosion and laser cutting.

8. An electron beam source according to claim 1, wherein said emission body is processed by first providing a substantially planar emission body and then forming therefrom a bent emission body.

9. An electron beam source according to claim 8, wherein said forming is performed after said slit pattern is applied to said emission body.

10. An electron beam source according to claim 8, wherein said forming is performed before said slit pattern is applied to said emission body.

11. An electron beam source according to claim 8, wherein said forming is performed by pressing.

12. An electron beam source according to claim 1, wherein said slit pattern is shaped so that when current flows along said current path from one terminal to the other, significant parts of said current path which lay one beside the other and are separated by said slits of said slit pattern, carrying current moving in opposite directions, said helically arranged slit pattern defining out of said emission body a first conductor branch leading from the periphery of said body helically to said central area, transmitting at said central area into a second conductor branch helically leading back to said periphery, said two branches being positioned one beside the other and separated by said slits.

13. An electron beam source according to claim 12, wherein said conductive terminals extends in substantially the same direction from the periphery of the body.

14. An electron beam source according to claim 13, wherein one of said conductive terminals is connected to one end of the helical path at a sharp bend and the other of said conductive terminals is connected to an opposite end of said helical path at a gentle bend.

15. An electron beam source according to claim 14, wherein said conductive terminals are substantially parallel to each other and parallel to the emission surface.

16. An electron beam source according to claim 15, wherein the width of said slits is, at least along substantial parts of said slit pattern, smaller than the width of said current path.

17. An electron beam source according to claim 14, wherein the emission body is supported only by the conductive terminals.

* * * * *